United States Patent
Woo et al.

(10) Patent No.: US 9,786,336 B2
(45) Date of Patent: Oct. 10, 2017

(54) MEMORY DEVICE CAPABLE OF OPERATION IN WIDE TEMPERATURE RANGE AND DATA PROCESSING SYSTEM AND METHOD OF OPERATING THE SAME

(71) Applicant: Samsung Electronics Co., Ltd., Suwon-si (KR)

(72) Inventors: Mi Young Woo, Seongnam-si (KR); Kae Won Ha, Seongnam-si (KR); Myong Jae Kim, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 58 days.

(21) Appl. No.: 14/801,860

(22) Filed: Jul. 17, 2015

(65) Prior Publication Data

US 2016/0078907 A1 Mar. 17, 2016

(30) Foreign Application Priority Data

Sep. 12, 2014 (KR) .................. 10-2014-0120782

(51) Int. Cl.
*G11C 7/04* (2006.01)
*G11C 11/406* (2006.01)
*G06F 3/06* (2006.01)

(52) U.S. Cl.
CPC .............. *G11C 7/04* (2013.01); *G06F 3/065* (2013.01); *G06F 3/0619* (2013.01); *G06F 3/0685* (2013.01); *G11C 11/40626* (2013.01)

(58) Field of Classification Search
CPC .......... G11C 7/04; G11C 2207/14; G11C 5/14
USPC ................................... 365/211, 174
See application file for complete search history.

(56) References Cited

U.S. PATENT DOCUMENTS

| | | | |
|---|---|---|---|
| 5,278,796 A | 1/1994 | Tillinghast et al. | |
| 5,539,186 A | 7/1996 | Abrami et al. | |
| 5,784,328 A | 7/1998 | Irrinki et al. | |
| 6,553,452 B2 | 4/2003 | Garlepp et al. | |
| 6,564,288 B2 | 5/2003 | Olarig et al. | |
| 6,564,742 B2 | 5/2003 | Perner et al. | |
| 6,647,310 B1 | 11/2003 | Yi et al. | |
| 7,165,183 B2 | 1/2007 | Okada et al. | |
| 7,324,398 B2 | 1/2008 | Shim et al. | |
| 7,450,456 B2 | 11/2008 | Jain et al. | |
| 7,677,796 B2 | 3/2010 | Janzen et al. | |
| 7,742,353 B2 | 6/2010 | Chen et al. | |
| 7,814,489 B2 | 10/2010 | Uemura et al. | |
| 8,192,082 B2 | 6/2012 | Song et al. | |
| 8,498,167 B1 | 7/2013 | Huang | |
| 8,648,463 B2 | 2/2014 | Thacker et al. | |
| 2003/0191889 A1* | 10/2003 | Forrer, Jr. ............... | G06F 1/206 711/112 |

(Continued)

*Primary Examiner* — Han Yang
(74) *Attorney, Agent, or Firm* — Muir Patent Law, PLLC

(57) ABSTRACT

A data processing system includes a first memory, a second memory, a temperature sensor, and a controller. The temperature sensor is configured to sense a temperature at the data processing system and generate a temperature signal. The controller is configured to control whether the first memory is enabled or disabled and whether the second memory is enabled or disabled based on the temperature signal and based on a first temperature threshold associated with the first memory and a second temperature threshold associated with the second memory.

20 Claims, 11 Drawing Sheets

(56) References Cited

U.S. PATENT DOCUMENTS

2007/0140030 A1* 6/2007 Wyatt ................. G11C 5/00
365/212
2013/0290600 A1* 10/2013 Tzafrir ............... G06F 11/004
711/103

* cited by examiner

MEMORY DEVICE CAPABLE OF OPERATION IN WIDE TEMPERATURE RANGE AND DATA PROCESSING SYSTEM AND METHOD OF OPERATING THE SAME

CROSS-REFERENCE TO RELATED APPLICATIONS

This application claims priority under 35 U.S.C. §119(a) from Korean Patent Application No. 10-2014-0120782 filed on Sep. 12, 2014, the disclosure of which is hereby incorporated by reference in its entirety.

BACKGROUND

Embodiments of the present disclosure relate to a memory device, and more particularly to a memory device that includes different memories, such as memory chips, manufactured to be capable of operating in different temperature ranges, and a data processing system having the same.

A semiconductor device such as a memory chip generates heat during an operation. An operational temperature refers to a temperature measured to be a different value from a temperature value around a semiconductor chip due to the heat generated inside the semiconductor chip.

The operational temperature of the semiconductor chip is closely related to reliability, an operation durability, and performance of the semiconductor chip. In general, the reliability of the semiconductor chip decreases as a temperature increases. In order to forecast reliability of a semiconductor chip, it is important to know a temperature of the semiconductor chip. The semiconductor chip can be used not only in a place with a constant ambient temperature but also in a very hot place, a very cold place, or a place with a big daily temperature variation such as a desert.

As described above, a temperature of a semiconductor chip may increase according to an operational condition (e.g., an operational voltage and/or an operational frequency) and an environmental condition. In the related art, a voltage supplied to a semiconductor chip, a frequency, or a transfer cycle of an instruction is changed by using a sensor which senses an increase in a temperature of the semiconductor chip. However, such a method cannot ensure reliability of the semiconductor chip in an extreme environmental condition. Even with a semiconductor chip having good performance in a room temperature, it is difficult to have good performance in a place with a low temperature such as Antarctic and Arctic or a place with a very big daily temperature range such as desert.

SUMMARY

Aspects of the present inventive concepts provide a memory device that includes different memory chips capable of operating in different temperature ranges, and a data processing system having the same and method of operating the same.

In one embodiment, a method of controlling a memory device in a data processing system is disclosed. The memory device may include at least a first memory chip and a second memory chip. The method may include generating a temperature signal that reflects a temperature at the data processing system; based on the temperature signal, determining if the temperature at the data processing system is lower than a low temperature threshold; based on the temperature signal, determining if the temperature at the data processing system is higher than a high temperature threshold; when it is determined that the temperature at the data processing system is lower than the low temperature threshold, enabling the second memory chip and disabling the first memory chip; and when it is determined that the temperature at the data processing system is higher than the high temperature threshold, enabling the first memory chip and disabling the second memory chip. The high temperature threshold has a higher temperature value than the low temperature threshold.

In one embodiment, when it is determined that the temperature at the data processing system is higher than the low temperature threshold and lower than the high temperature threshold, both the first memory chip and the second memory chip are enabled.

In one embodiment, when it is determined that the temperature at the data processing system is higher than the low temperature threshold and lower than the high temperature threshold, data is copied from one of the first memory chip or second memory chip to the other of the first memory chip or second memory chip.

In one embodiment, the method additionally includes copying data from the second memory chip to the first memory chip when a temperature passes and increases above the low temperature threshold, and copying data from the first memory chip to the second memory chip when a temperature passes and decreases below the high temperature threshold.

The temperature signal may reflect an ambient temperature at the memory device.

In one embodiment, the method additionally includes controlling the first memory chip to operate within a first range of temperatures; and controlling the second memory chip to operate within a second range of temperatures. T the first range of temperatures may be higher than the second range of temperatures, and the first range of temperatures may overlap the second range of temperatures.

In one embodiment, the first memory chip operates most efficiently in the first range of temperatures; and the second memory chip operates most efficiently in the second range of temperatures.

In one embodiment, the first memory chip is part of a first semiconductor package of the memory device, and the second memory chip is part of a second semiconductor package of the memory device.

In one embodiment, the enabling/disabling of the first and second memory chips is accomplished using a chip enable signal.

Another exemplary embodiment is directed to a data processing system, including a first memory, a second memory, a temperature sensor, and a controller. The temperature sensor is configured to sense a temperature at the data processing system and generate a temperature signal. The controller is configured to control whether the first memory is enabled or disabled and whether the second memory is enabled or disabled based on the temperature signal and based on a first temperature threshold associated with the first memory and a second temperature threshold associated with the second memory.

In one embodiment, the controller is configured to enable only the first memory when the sensed temperature is higher than the first temperature threshold, and enable only the second memory when the sensed temperature is lower than the second temperature threshold, wherein the second temperature threshold is lower than the first temperature threshold.

In one embodiment, the controller is configured to enable the first memory and the second memory when the sensed temperature is higher than the second temperature threshold and is lower than the first temperature threshold.

In one embodiment, the controller is configured to enable the second memory and copy data stored in the first memory into the enabled second memory when the sensed temperature becomes lower than the first temperature threshold, and to disable the first memory when the sensed temperature becomes lower than the second temperature threshold.

In one embodiment, the controller is configured to enable the first memory and copy data stored in the second memory into the enabled first memory when the sensed temperature becomes higher than the second temperature threshold, and disable the second memory chip when the sensed temperature becomes higher than the first temperature threshold.

In one embodiment, the first memory and the second memory are first and second respective memory chips packaged into one package.

In one embodiment, the first memory and the second memory are first and second respective memory chips attached to one memory module.

In one embodiment, the first and second memories are part of a memory device connected to the controller through an interface, and the temperature sensor is located at one of the controller or the memory device.

According to another exemplary embodiment, a controller for controlling a memory device including a first memory chip and a second memory chip is disclosed. The controller is configured to: determine whether a sensed temperature at one of the controller or the memory device is higher than a first threshold temperature; determine whether the sensed temperature is lower than a second threshold temperature; enable the first memory chip and disable the second memory chip when the sensed temperature is higher than the first threshold temperature; and enable the second memory chip and disable the first memory chip when the sensed temperature is lower than the second threshold temperature. The second threshold temperature is lower than the first threshold temperature.

In one embodiment, the controller is further configured to enable both the first memory chip and the second memory chip when the sensed temperature is higher than the second threshold temperature, and is lower than the first threshold temperature.

In one embodiment, the controller is further configured to, when the sensed temperature is lower than the first threshold temperature and higher than the second threshold temperature, copy data from one of the first memory chip and the second memory chip to the other of first memory chip and the second memory chip.

BRIEF DESCRIPTION OF THE DRAWINGS

These and/or other aspects and advantages of the present inventive concepts will become apparent and more readily appreciated from the following description of the embodiments, taken in conjunction with the accompanying drawings of which.

DETAILED DESCRIPTION OF THE EMBODIMENTS

Figure 1:
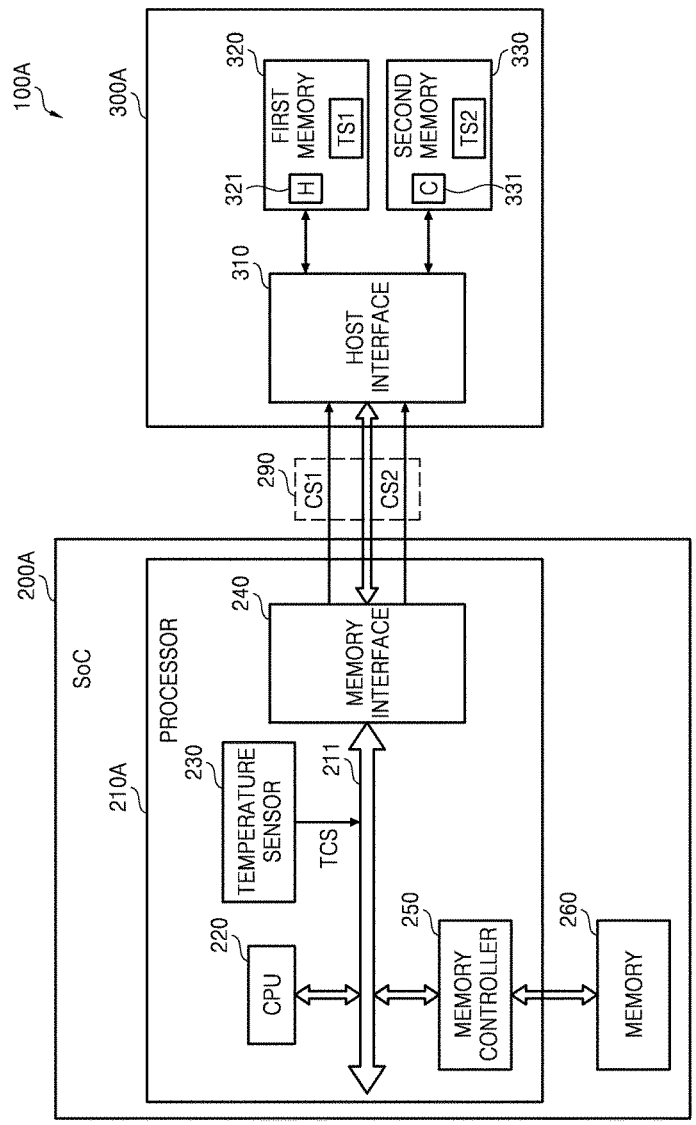
FIG. 1 is a block diagram of a data processing system according to an exemplary embodiment of the present inventive concepts.

The present disclosure now will be described more fully hereinafter with reference to the accompanying drawings, in which embodiments of the invention are shown. This invention may, however, be embodied in many different forms and should not be construed as limited to the embodiments set forth herein. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless the context indicates otherwise, these terms are only used to distinguish one element from another, for example as a naming convention. For example, a first signal or device could be termed a second signal or device, and, similarly, a second signal or device could be termed a first signal or device without departing from the teachings of the disclosure. Thus, a first signal or device discussed below in one section of the specification could be termed a second signal or device in another section of the specification or in the claims without departing from the teachings of the present disclosure. In addition, in certain cases, even if a term is not described using "first," "second," etc., in the specification, it may still be referred to as "first" or "second" in a claim in order to distinguish different claimed elements from each other.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Terms such as "same," or "equal" as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes or small operational differences. The term "substantially" may be used herein to reflect this meaning.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a data processing system according to an exemplary embodiment of the present inventive concepts. Referring to FIG. 1, a data processing system 100A may include a controller 200A and a memory device 300A. The controller 200A and the memory device 300A may transmit or receive a command and/or data to or from each other through an interface 290.

Each of data processing system 100A to 100F to be described in the present specification may include a personal computer (PC), a desktop computer, a laptop computer, a workstation computer, or a portable computing device. The portable computing device may be embodied in a mobile phone, a smart phone, a tablet PC, a personal digital assistant (PDA), an enterprise digital assistant (EDA), a digital still camera, a digital video camera, a portable multimedia player (PMP), a multimedia device, a personal navigation device or portable navigation device (PND), a handheld game console, a mobile internet device (MID), a wearable computer, an internet of things (IoT) device, an internet of everything (IoE) device, a drone, or an e-book, for example. However, each of the data processing systems 100A to 100F may also include other types of electronic devices, such as an engine control unit (ECU), or any electronic device that processes information and stores information.

The controller 200A may be embodied in an integrated circuit (IC), a motherboard, a system on chip (SoC), an application processor (AP), or a mobile AP, for example. When the controller 200A is embodied in a SoC, a processor 210A and a memory 260 may be integrated into the SoC. At this time, the processor 210A may be embodied in an AP or a mobile AP.

The controller 200A may include the processor 210A and the memory 260. The controller 200A may perform a function of a host which can control an operation of the memory device 300A. In one embodiment, the controller 200A includes a central processing unit (CPU) 220, a temperature sensor 230, a memory interface 240, and a memory controller 250.

The CPU 220 may control an operation of the temperature sensor 230, the memory interface 240, and the memory controller 250 through one or more buses 211. The CPU 220 may include one or more cores. The temperature sensor 230 may sense an ambient temperature of the processor 210A or the controller 200A, and generate a temperature signal TCS according to a result of the sensing. The temperature signal TCS may mean a signal, e.g., a digital signal, which can be processed by the CPU 220.

For convenience of description in FIG. 1, an exemplary embodiment in which the temperature sensor 230 is embodied inside the processor 210A is shown; however, the temperature sensor 230 may be embodied outside the processor 210A. For example the temperature sensor 230 may be embodied in an SPD (serial presence detect) temperature sensor.

The memory interface 240 may be connected to a host interface 310 through the interface 290 (the various interfaces described herein are also described as interface circuits), and may transmit or receive a command and/or data to or from the host interface 310. The memory controller 250 may transmit or receive a command and/or data to or from the memory 260 according to a control of the CPU 220. According to an exemplary embodiment, the processor 210A and the memory 260 may be packaged into one package (e.g., a device including a package substrate and one or more semiconductor chips mounted thereon). As such, the processor 210A and the memory 260 may transmit or receive a command and/or data to or from each other through through-substrate vias such as through-silicon vias (TVSs) and/or bonding wires.

According to exemplary embodiments, the memory 260 may be embodied in a volatile memory and/or a non-volatile memory. The volatile memory may be embodied in a random access memory (RAM), a dynamic RAM (DRAM), or a static RAM (SRAM). The non-volatile memory may be embodied in an electrically erasable programmable read-only memory (EEPROM), a flash memory, a magnetic RAM (MRAM), a spin-transfer torque MRAM, a ferroelectric RAM (FeRAM), a phase change RAM (PRAM), or a resistive RAM (RRAM).

According to exemplary embodiments, the memory 260 may be embodied in a hard disk drive (HDD), a smart card, a secure digital (SD) card, a multimedia card (MMC), an embedded MMC (eMMC), an embedded multi-chip package (eMCP), a perfect page NAND (PPN), a universal flash storage (UFS), a solid state drive (SSD), or an embedded SSD. According to exemplary embodiments, the memory 260 may be embodied in a fixed memory or a removable memory.

The memory device 300A includes the host interface 310, a first memory 320, and a second memory 330. For example, the memory device 300A may include different memories 320 and 330, which in one embodiment are manufactured by different manufacturing processes to be capable of operating, or designed for optimal operation, in different temperature ranges. According to an exemplary embodiment, the memories 320 and 330 may be memories of the same type or memories of different types. For example, the memories 320 and 330 may be DRAMs, the first memory 320 may be a volatile memory, and the second memory 330 may be a non-volatile memory. Moreover, the memories 320 and 330 may be non-volatile memories of different types.

Each of the memories 320 and 330 may be a semiconductor device, such as a chip (e.g., a die or an IC-die), a stack of chips, or a package. According to exemplary embodiments, the memory device 300A may be a semiconductor package or memory package. For example, the memory device 300A may include a plurality of semiconductor devices stacked on each other in package form, wherein each of the semiconductor devices is a different device (e.g., a different memory, a different chip, a different package). The memory device 300 may also be formed in module form, as a memory module.

The semiconductor package or memory package may be embodied in a package on package (PoP), ball grid arrays (BGAs), chip scale packages (CSPs), a plastic leaded chip carrier (PLCC), a plastic dual in-line package (PDIP), a chip on board (COB), a CERamic dual in-line package (CERDIP), a plastic metric quad flat pack (MQFP), a thin quad flat pack (TQFP), a small-outline integrated circuit (SOIC), a shrink small outline package (SSOP), a thin small outline (TSOP), a system in package (SIP), a multi chip package (MCP), a wafer-level package (WLP), or a wafer-level processed stack package (WSP).

The host interface 310 may transmit or receive a command and/or data to or from the memory interface 240 through the interface 290. The interface 290 may include lines connected between the controller 200A and the memory device 300A.

The first memory 320 (e.g., a first semiconductor device such as a first memory chip) may include a first storage device 321 which stores a first temperature identification (ID) (H), a first temperature sensor TS1, a memory cell array (not shown) which stores data, and an access control circuit (not shown) which controls an access operation, e.g., a read operation or a write operation, to the memory cell array.

The second memory 330 (e.g., a first semiconductor device such as a second memory chip) may include a second storage device 331 which stores a second temperature ID (C), a second temperature sensor TS2, a memory cell array (not shown) which stores data, and an access control circuit (not shown) which controls an access operation, e.g., a read operation or a write operation, to the memory cell array.

Each of the storage devices 321 and 331 may be embodied, for example, in a register, a fuse, an e-fuse, or an anti-fuse. Each of the storage devices 321 and 331 may be any type of storage device which can store each of the temperature IDs H and C.

The first temperature ID (H) comprises information (e.g., an indicator) which represents temperature characteristics of the first memory 320, and the second temperature ID (C) comprises information (e.g., an indicator) which represents temperature characteristics of the second memory 330. For example, the memory device 300A may be a memory device operating in a wide temperature range (e.g., −40° C. to 125° C.). In one embodiment, the first memory 320 is a memory that can be enabled in a first temperature range (e.g., 60° C. to 125° C.), and the second memory 330 is a memory that can be enabled in a second temperature range (e.g., −40° C. to 80°). For example, the first memory 320 may be designed to operate best (or operate properly) in the first temperature range, and the second memory 330 may be designed to operate best (or operate properly) in the second temperature range. As such, as described further below, in some embodiments, the data processing system 100A is configured (e.g., based on the controller 200A) to operate the first memory 320 in the first temperature range and to operate the second memory 330 in the second temperature range.

In certain embodiments, the first temperature ID (H) is data or information that represents that the first memory can or should be enabled in the first temperature range, and the second temperature ID (C) is data or information which represents that the second memory can or should be enabled in the second temperature range. For example, the first memory 320 may be a memory for relatively high temperature that can perform high performance at a high temperature, and the second memory 330 may be a memory for relatively low temperature that can perform high performance at a low temperature. Figures or numbers described above are merely for description, and a technical concept of the present inventive concepts is not limited to the figures or numbers disclosed above.

Figure 2:
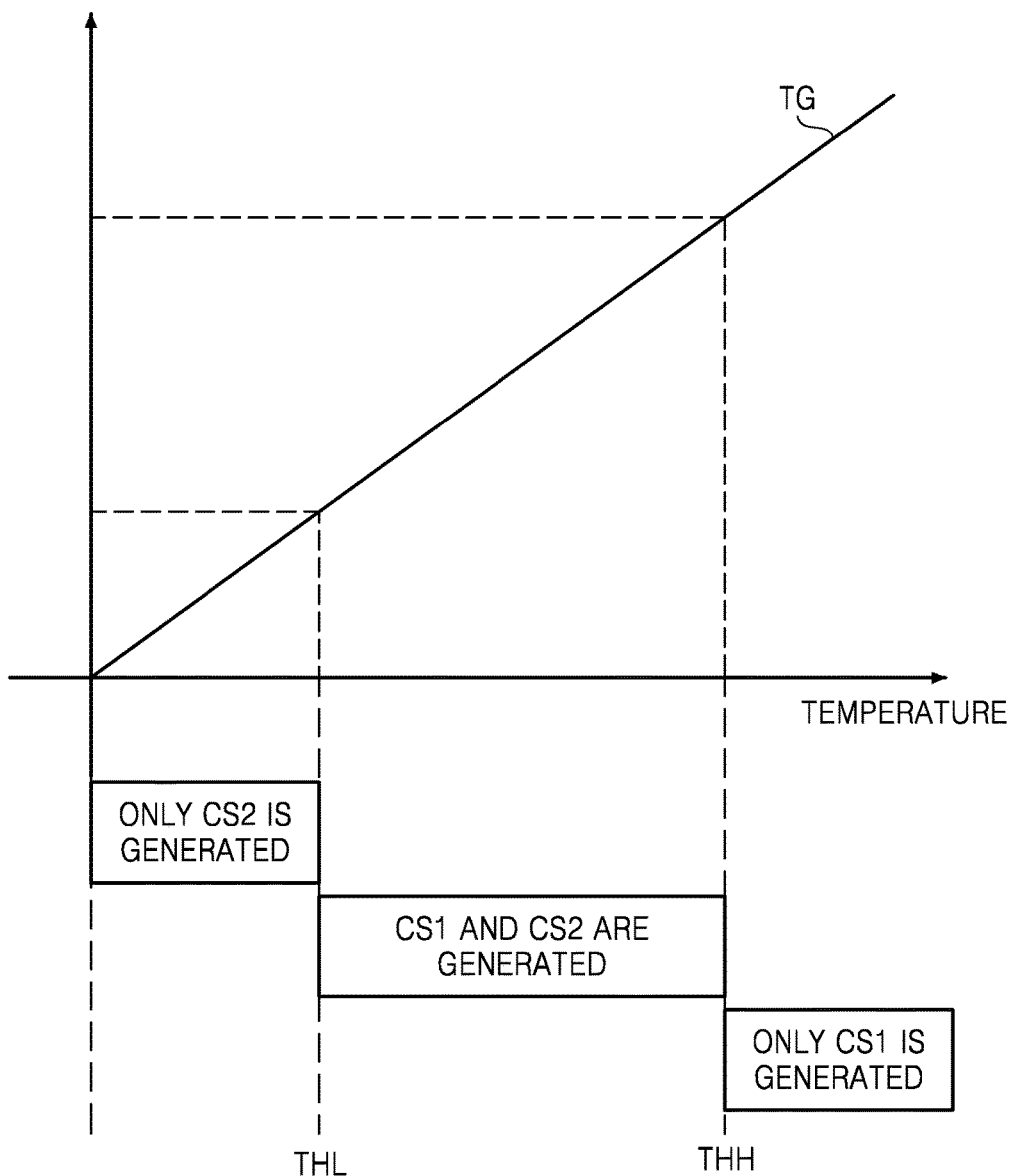
FIG. 2 shows memories enabled according to an ambient temperature, according to an exemplary embodiment.

FIG. 2 shows memories enabled according to an ambient temperature, according to an exemplary embodiment. Referring to FIG. 2, it is assumed that a low temperature critical (or threshold) temperature (which may be referred to as a second temperature) THL is 60° C., and a high temperature critical (or threshold) temperature (which may be referred to as a first temperature) THH is 80° C. It is noted that the ambient temperature, or the temperature at the data processing system 100A, may be caused by external influences, the data processing system's own heat, or a combination of the two.

Figure 3:
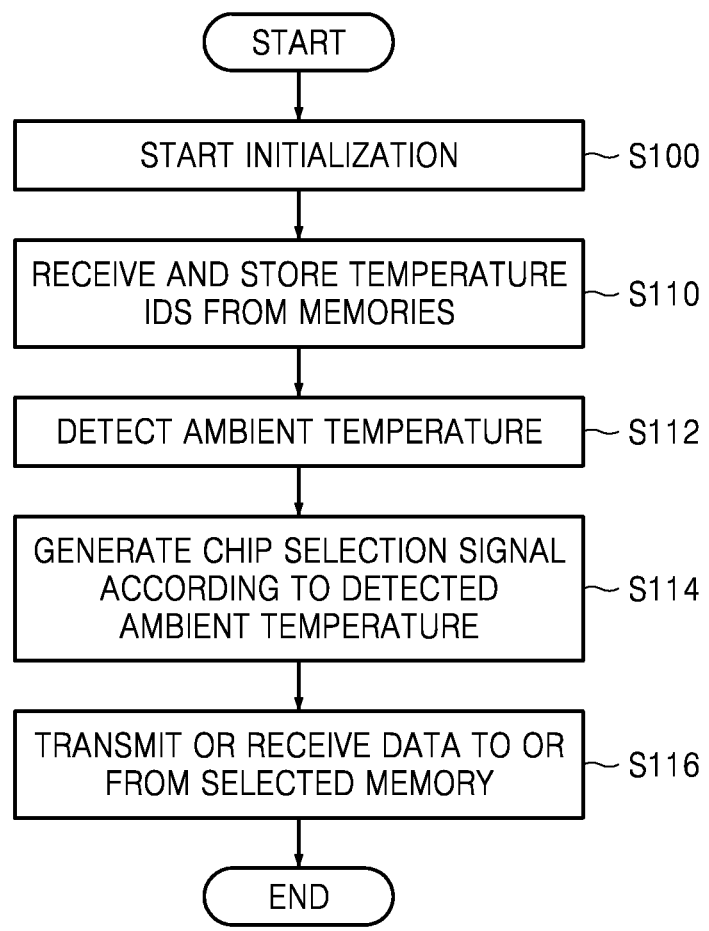
FIG. 3 is a flowchart which describes an initialization operation of the data processing system shown in FIG. 1, according to an exemplary embodiment.

FIG. 3 is a flowchart describing an initialization operation of the data processing system shown in FIG. 1, according to one exemplary embodiment. Referring to FIGS. 1 to 3, when operation voltages are supplied to the data processing system 100A for a booting, for example, when an initialization operation is performed (S100), the CPU 220 reads the first temperature ID (H) stored in the first storage device 321 of the first memory 320, and the second temperature ID (C) stored in the second storage device 331 of the second memory 330 using interfaces 240, 290, and 310, and stores the temperature IDs (H and C) which are read in the memory 260 through the memory controller 250 (S110). According to exemplary embodiments, the temperature IDs (H and C) which are read may be stored in a cache or an internal memory which can be accessed by the CPU 220.

The temperature sensor 230 may detect an ambient temperature of the processor 210A and output a temperature signal TCS. In one embodiment, the TCS is a signal that corresponds to a temperature sensed by the temperature sensor 230. Thus, a TCS corresponding to a first sensed temperature may have a different value from a TCS corresponding to a second, different temperature. The TCS may reflect a temperature at the data processing system 100A. The CPU 220, or software or firmware which is performed by the CPU 220 may select a memory to be enabled among the memories 320 and 330 using the first temperature ID (H), the second temperature ID (C), and the temperature signal TCS, and output the enable signal CS1 and/or CS2 to a selected memory 320 and/or 330 through the interface 290 (S114). For example, the enable signal CS1 and/or CS2 may be embodied in a chip select signal.

The controller 200A may transmit or receive data to or from the selectively enabled memory 320 and/or 330 (S116).

For example, in the embodiment described above in connection with FIGS. 1 and 2, if the sensed temperature is between (or equal to, for example) 60° C. and 80° C., both the CS1 and CS2 (generally referred to as a first select signal and a second select signal) may be generated such that both memories operate. If the sensed temperature is above 80° C., only the CS1 may be generated, such that only the first memory 320 is enabled (the second memory 330 may be disabled), and if the sensed temperature is below 60° C., only the CS2 may be generated, such that only the second memory 330 is enabled (the first memory 320 may be disabled).

Figure 4:
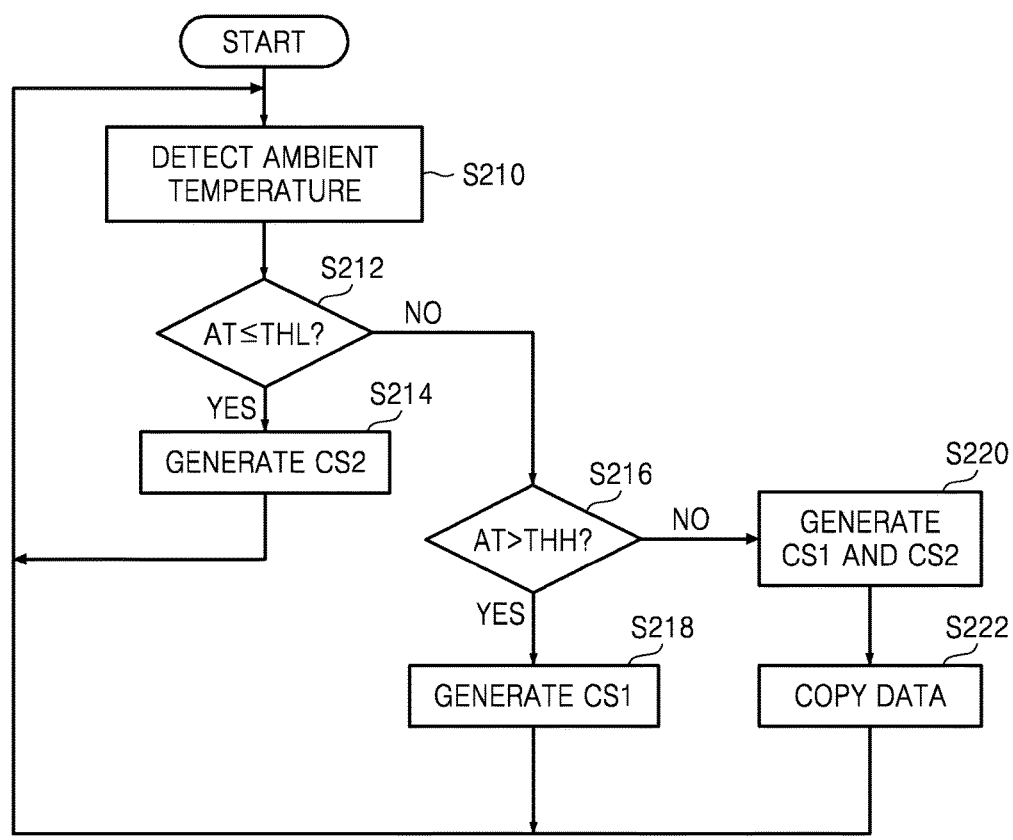
FIG. 4 is a flowchart which describes an operation of the data processing system shown in FIG. 1, according to an exemplary embodiment.

FIG. 4 is a flowchart that describes an operation of the data processing system shown in FIG. 1, according to one exemplary embodiment. As described referring to FIG. 2, it is assumed that the second temperature THL is 60° C., and the first temperature THH is 80° C.

After an initialization operation on the data processing system 100a is completed, the temperature sensor 230 may detect an ambient temperature of the controller 200A, and output a temperature signal TCS corresponding to a result of the detection (S210). The ambient temperature may refer to, for example, a temperature immediately surrounding the controller 200A, for example, a temperature primarily influenced by the heat of the controller 200A and/or processor 210A itself (though the temperature may also be affected by other external influences). In other embodiments, the ambient temperature may refer to a temperature surrounding an electronic device, such as the data processing system 100A itself, which may reflect a temperature of the electronic device, or a temperature immediately outside the electronic device. In certain embodiments, a temperature sensor is located at the memory device 300A and measures the ambient temperature at the memory device 300A (e.g., the temperature immediately surrounding the memory device 300A). In general, the temperature sensor may be located at the data processing system 100A to measure a temperature at the data processing system 100A, for example a temperature of at least part of the data processing system 100A.

The CPU 220, or software or firmware controlled by the CPU 220 may determine an ambient temperature AT corresponding to the temperature signal TCS, and compare the ambient temperature AT with the second temperature THL (S212). Hereinafter, the CPU 220, including the software and/or firmware may be collectively referred to as the CPU 220.

When the ambient temperature AT is equal to or lower than the second temperature THL (S212), referred to herein as a first, or low temperature range (relatively speaking) the CPU 220 may generate a second enable signal CS2 which can enable the second memory 330 corresponding to the second temperature ID (C), and output the second enable signal CS2 to the memories 320 and 330 through the interfaces 240, 290, and 310 (S214). Only the second memory 330 of the memories 320 and 330 may be enabled. Accordingly, the controller 200A may transmit or receive data to or from the enabled second memory 330. At this time, the first memory 320 is disabled in response to the second enable signal CS2. This time period may be referred to as a low-temperature operational period.

When the ambient temperature AT is higher than the second temperature THL (S212), the CPU 220 may determine whether or not the ambient temperature AT is higher than the first temperature THH (S216). When the ambient temperature AT is higher than the second temperature THL, and is equal to or lower than the first temperature THH, referred to herein as a second, or mid-temperature range (relatively speaking), the CPU 220 may generate the second enable signal CS2 which can enable the second memory 330 corresponding to the second temperature ID (C) and a first enable signal CS1 which can enable the first memory 320 corresponding to the first temperature ID (H) (S220), and output the enable signals CS1 and CS2 to the memories 320 and 330 through the interfaces 240, 290, and 310 (S220). Each of the memories 320 and 330 is enabled in response to each of the enable signals CS1 and CS2. This time period where both memories 320 and 330 are enabled may be referred to as a mid-temperature operational period.

In one embodiment, the controller 200A may read data stored in the second memory 330, and output commands for performing an operation of copying the data, which are read from the second memory 320, through the interfaces 240, 290, and 310. Accordingly, the data stored in the second memory 330 are copied into the first memory 320 as they are transferred through the controller 200A (S222).

According to an exemplary embodiment, when the controller 200A outputs commands for performing an operation of copying the data stored in the second memory 330 into the first memory 320, the data stored in the second memory 330 may be copied into the first memory 320. In one embodiment, the copy can be performed inside of the memory device 300A, not via the controller 200A.

As such, data stored in the first memory prior to and during the mid-temperature operational period may be copied to the first memory 320 as the temperature increases during the mid-temperature operational period.

When the ambient temperature AT is (or gets) higher than the first temperature THH (S216), referred to herein as a third, or high-temperature range (relatively speaking) the CPU 220 may generate the first enable signal CS1 which can enable the first memory 320 corresponding to the first temperature ID (H), and output the first enable signal CS1 to the memories 320 and 330 through the interfaces 240, 290, and 310 (S218). In response to the first enable signal CS1, only the first memory 320 of the memories 320 and 330 may be enabled. Accordingly, the controller 200A may transmit or receive data to or from the enabled first memory 320. This time period may be referred to as a high-temperature operational period.

The enable signals described herein may relate to an output signal in an enable state (e.g., as opposed to the output signal being in a disable state).

In one embodiment, assuming that the ambient temperature AT linearly increases according to a temperature curve TG of FIG. 2, the controller 200A may process data only using the second memory 330 when the ambient temperature AT is equal to or lower than the second temperature THL, the controller 200a may copy data stored in the second memory 330 into the first memory 320 when the ambient temperature AT reaches the second temperature THL and when it is between the second temperature THL and the first temperature THH, and the controller 200A may process the data only using the first memory 320 when the ambient temperature AT reaches and exceeds the first temperature THH.

On the contrary, assuming that the ambient temperature AT linearly decreases according to the temperature curve TG of FIG. 2, the controller 200A may process data only using the first memory 320 when the ambient temperature AT is higher than the first temperature THH, the controller 200A may copy data stored in the first memory 320 into the second memory 330 when the ambient temperature AT reaches the first temperature THH and is between the first temperature THH and the second temperature THL, and the controller 200A may process the data only using the second memory 330 when the ambient temperature AT reaches and is below the second temperature THL. Accordingly, the memory device 300A may stably operate in a wide temperature range through a switch between the memories 320 and 330. In example embodiments, the first memory 320 as described above is referred to as a high temperature memory, and the second memory 330 as described above is referred to as a low temperature memory (relative to the first memory 320).

Figure 5:
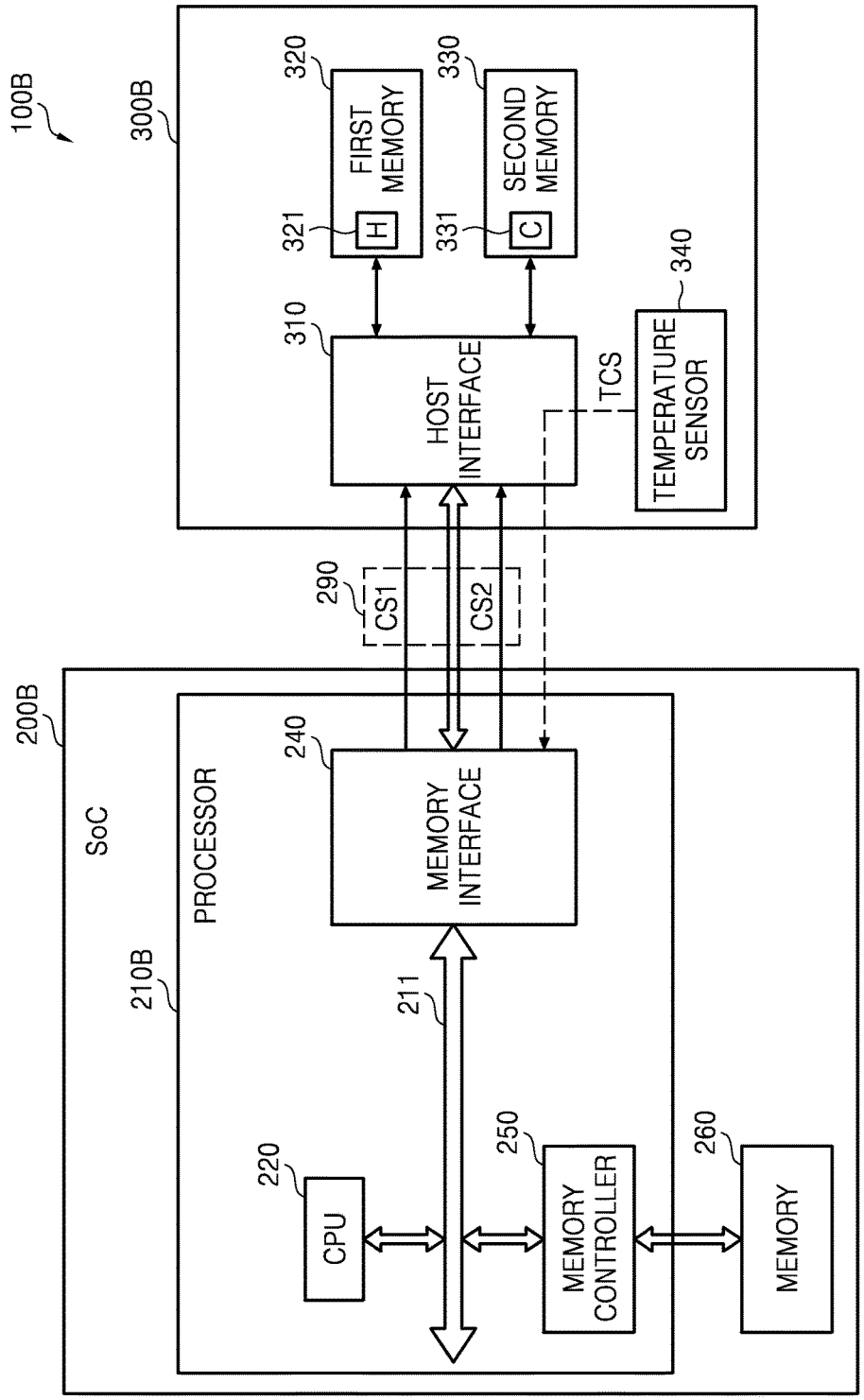
FIG. 5 is a block diagram of the data processing system according to another exemplary embodiment of the present inventive concepts.

FIG. 5 is a block diagram of the data processing system according to another exemplary embodiment of the present inventive concepts. Referring to FIG. 5, a data processing system 100B may include a controller 200B and a memory device 300B. The controller 200B and the memory device 300B may transmit or receive a command and/or data to or from each other through the interface 290.

Except that the CPU 220 receives a temperature signal TCS from the memory device 300B, a structure and an operation of the data processing system 100A shown in FIG. 1 are substantially the same as or similar to a structure and an operation of the data processing system 100B shown in FIG. 5.

The memory device 300B includes a temperature sensor 340 which senses an ambient temperature of the memory device 300B and outputs a temperature signal TCS. The temperature signal TCS output from the temperature sensor 340 may be transferred to the CPU 220 through the interfaces 240, 290, and 310. The temperature sensed by the temperature sensor 340 may be for example a temperature immediately surrounding the memory device 300B, which may be a effective temperature at which the memory device 300B is operating.

The temperature sensor 340 may perform a function the same as or similar to a temperature sensor TS1 of the first memory 320 and/or a temperature sensor TS2 of the second memory 330. According to exemplary embodiments, a temperature signal output from the temperature sensor TS1 of the first memory 320 and/or the temperature sensor TS2 of the second memory 330 instead of the temperature sensor 340 may be transferred to the CPU 220 through the interfaces 240, 290, and 310. That is, the temperature signal in FIG. 5 may be interpreted to include a temperature signal output from at least one of the temperature sensor 340, the temperature sensor TS1 of the first memory 320 and the temperature sensor TS2 of the second memory 330.

Methods the same as or similar to the methods described referring to FIGS. 2 to 4 may be applied to a data processing system 100B as they are. The memory device 300B may be, for example, a semiconductor package. A type of the semiconductor package may be the same as described above.

It should be noted that different determinations may be made by different circuitry within the combined system including the controller 200B (or 200A above) and memory device 300B (or 300A above). For example, as discussed above, the temperature sensor can be located at the controller or the memory device. In addition, though the temperature sensor is described as generating a temperature signal TCS and transmitting it to the CPU, at which point the CPU may perform a determination/comparison between the TCS and a high or low temperature THH or THL, in some embodiments, the comparison can be performed by circuitry other than by the CPU. As such, different circuitry for performing certain tasks may be disposed at different locations within the system.

Figure 6:
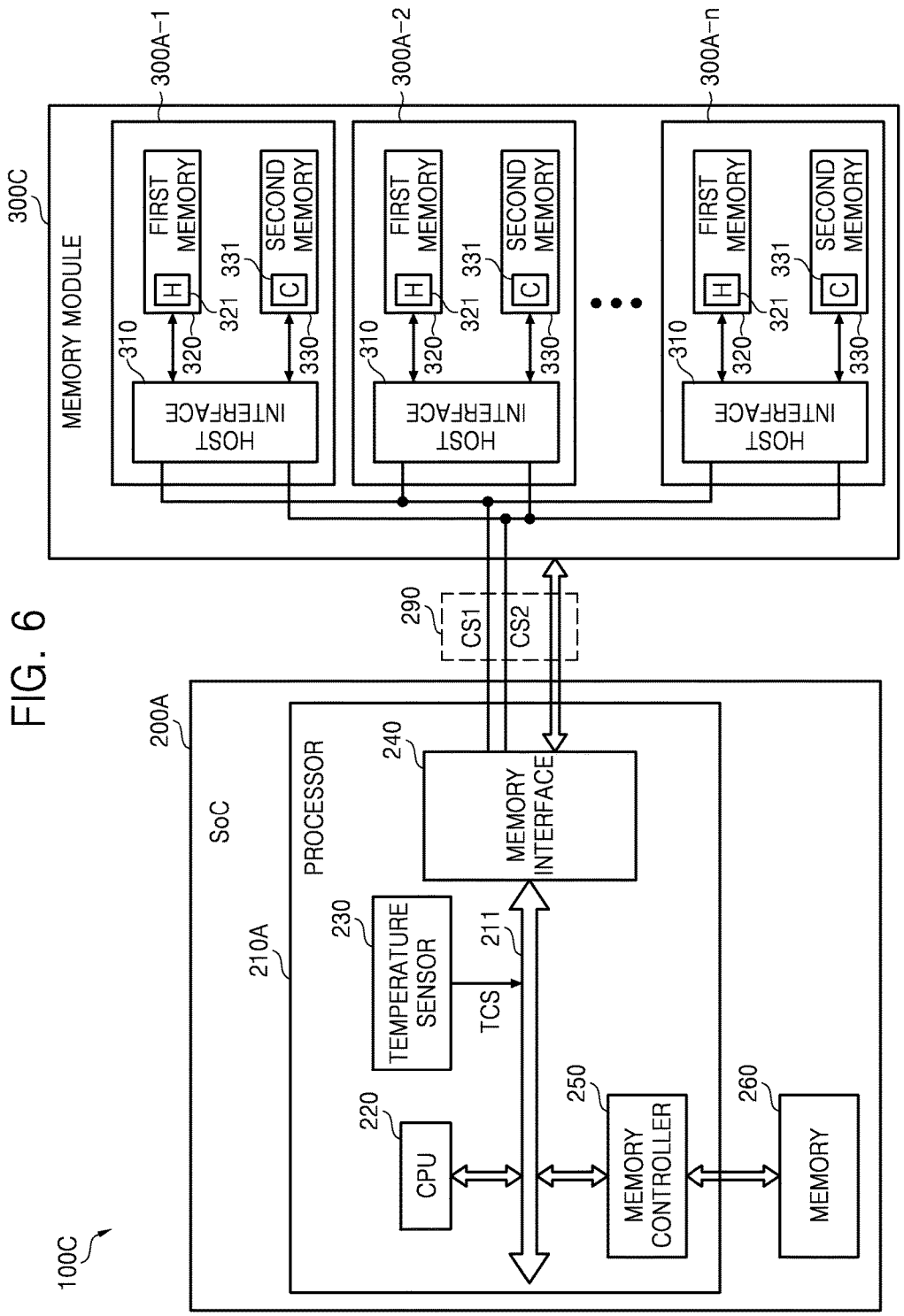
FIG. 6 is a block diagram of the data processing system according to still another exemplary embodiment of the present inventive concepts.

FIG. 6 is a block diagram of the data processing system according to still another exemplary embodiment of the present inventive concepts. Referring to FIG. 6, a data processing system 100C may include the controller 200A and the memory device 300C. The controller 200A and the memory device 300C may transmit or receive a command and/or data through the interface 290.

The memory device 300C may be embodied in a memory module. The memory module may be embodied, for example, in a dual in-line memory module (DIMM), a single in-line memory module (SIMM), a small outline dual in-line memory module (SO-DIMM), a Rambus memory module, a buffered (Registered) DIMM, a fully buffered DIMM (FB-DIMM), or an unbuffered DIMM.

The memory device 300C includes a plurality of memory devices 300A-1 to 300A-n, where n is a natural number equal to or more than two (2). A structure and an operation of each of the plurality of memories 300A-1 to 300A-n are substantially the same as or similar to a structure and an operation of the memory device 300A shown in FIG. 1. For example, each memory may be a chip or a semiconductor package.

Each first memory 320 embodied in each of the memory devices 300A-1 to 300A-n is enabled according to the first enable signal CS1. Moreover, each second memory 330 embodied in each of the memory devices 300A-1 to 300A-n is enabled according to the second enable signal CS2.

Assuming that the ambient temperature AT linearly increases according to the temperature curve TG of FIG. 2, the controller 200A may process data only using each second memory 330 embodied in each of the memory devices 300A-1 to 300A-n when the ambient temperature AT is equal to or lower than the second temperature THL, the controller 200A may copy data stored in each second memory 330 embodied in each of the memory devices 300A-1 to 300A-n into each first memory 320 embodied in each of the memory devices 300A-1 to 300A-n when the ambient temperature AT reaches the second temperature THL and continues to increase, and the controller 200A may process data only using each first memory 320 embodied in each of the memory devices 300A-1 to 300A-n when the ambient temperature AT reaches and exceeds the first temperature THH.

On the contrary, assuming that the ambient temperature AT linearly decreases according to the temperature curve TG of FIG. 2, the controller 200A may process data only using each first memory 320 embodied in each of the memory devices 300A-1 to 300A-n when the ambient temperature AT is higher than the first temperature THH, the controller 200A may copy data stored in each first memory 320 embodied in each of the memory devices 300A-1 to 300A-n into each second memory 330 embodied in each of the memory devices 300A-1 to 300A-n when the ambient temperature AT reaches the first temperature THH and continues to decrease, and the controller 200A may process the data only using each second memory 330 embodied in each of the memory devices 300A-1 to 300A-n when the ambient temperature AT reaches and is lower than the second temperature THL.

According to an exemplary embodiment, data stored in one of the first memory 320 and the second memory 330 included in the same memory device may be copied into the other of the first memory 320-1 and the second memory 330-1 included in the same memory device according to a copy operation controlled by the controller 200A. At that time, data copy may be performed inside the memory device. According to another exemplary embodiment, data stored in one of the first memory 320 and the second memory 330 included in one memory device may be copied into one of the first memory 320 and the second memory 330 included in the other memory device according to the copy operation controlled by the controller 200A. As such, the data copy may be performed between memory devices.

Figure 7:
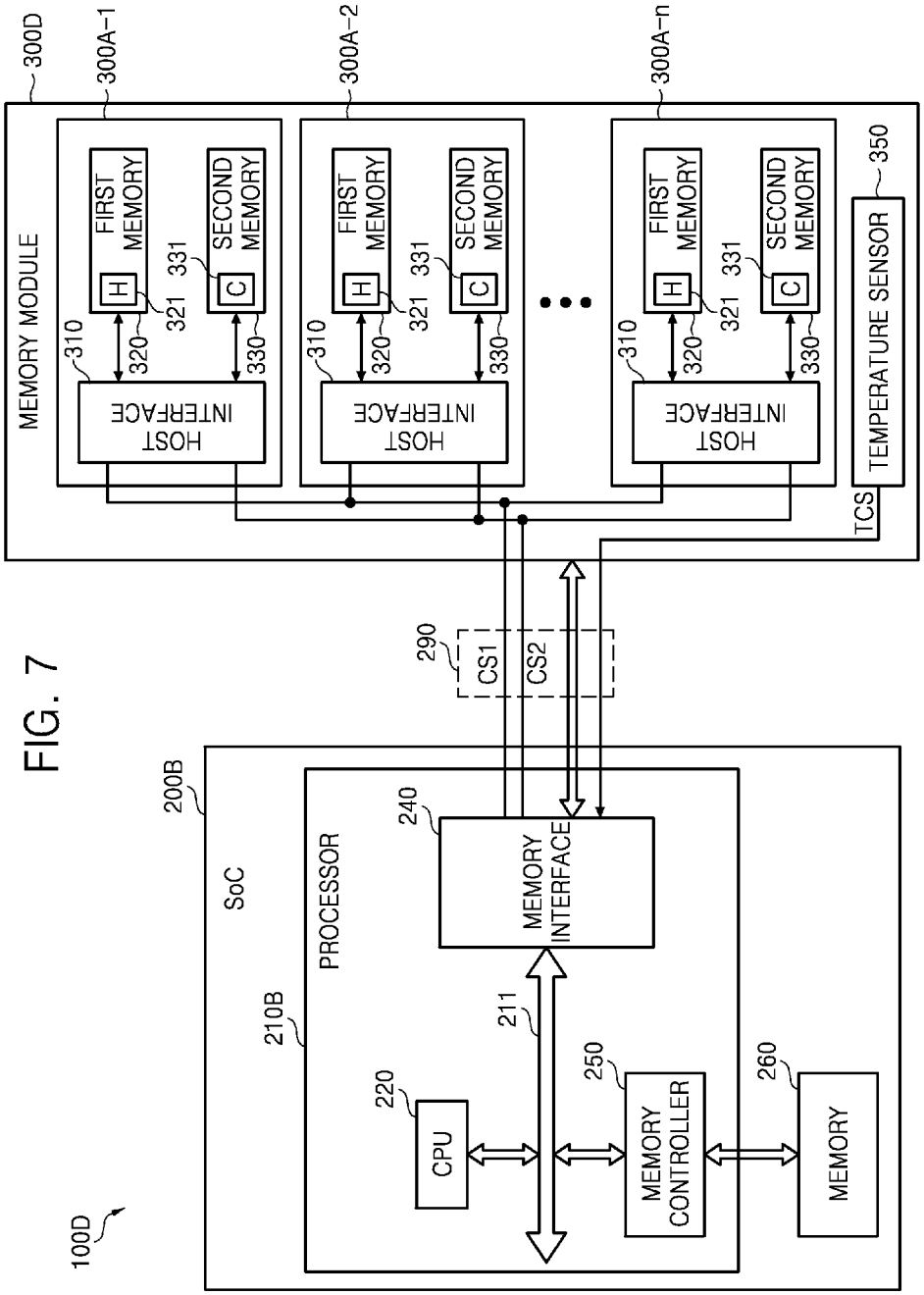
FIG. 7 is a block diagram of the data processing system according to still another exemplary embodiment of the present inventive concepts.

FIG. 7 is a block diagram of the data processing system according to still another exemplary embodiment of the present inventive concepts. Referring to FIG. 7, a data processing system 100D may include the controller 200B and a memory device 300D. The controller 200B and the memory device 300D may transmit or receive a command and/or data to or from each other through the interface 290.

Except that the CPU 220 receives a temperature signal TCS form the memory device 300D, a structure and an operation of the data processing system 100C shown in FIG.

6 are substantially the same as a structure and an operation of the data processing system 100D shown in FIG. 7.

The memory device 300D may be embodied in a memory module described above. The memory device 300D includes a temperature sensor 350 which senses an ambient temperature of the memory device 300D and outputs a temperature signal TCS. The temperature signal output from the temperature sensor 350 may be transferred to the CPU 220 through the interfaces 240 and 290.

The temperature sensor 350 may perform a function the same as or similar to the temperature sensor TS1 of the first memory 320 and/or the temperature sensor TS2 of the second memory 330 shown in FIG. 1. According to exemplary embodiments, a temperature signal output from the temperature sensor TS1 of the first memory 320 and/or the temperature sensor TS2 of the second memory 330 instead of the temperature sensor 350 may be transferred to the CPU 220 through the interfaces 240, 290, and 310.

Figure 8:
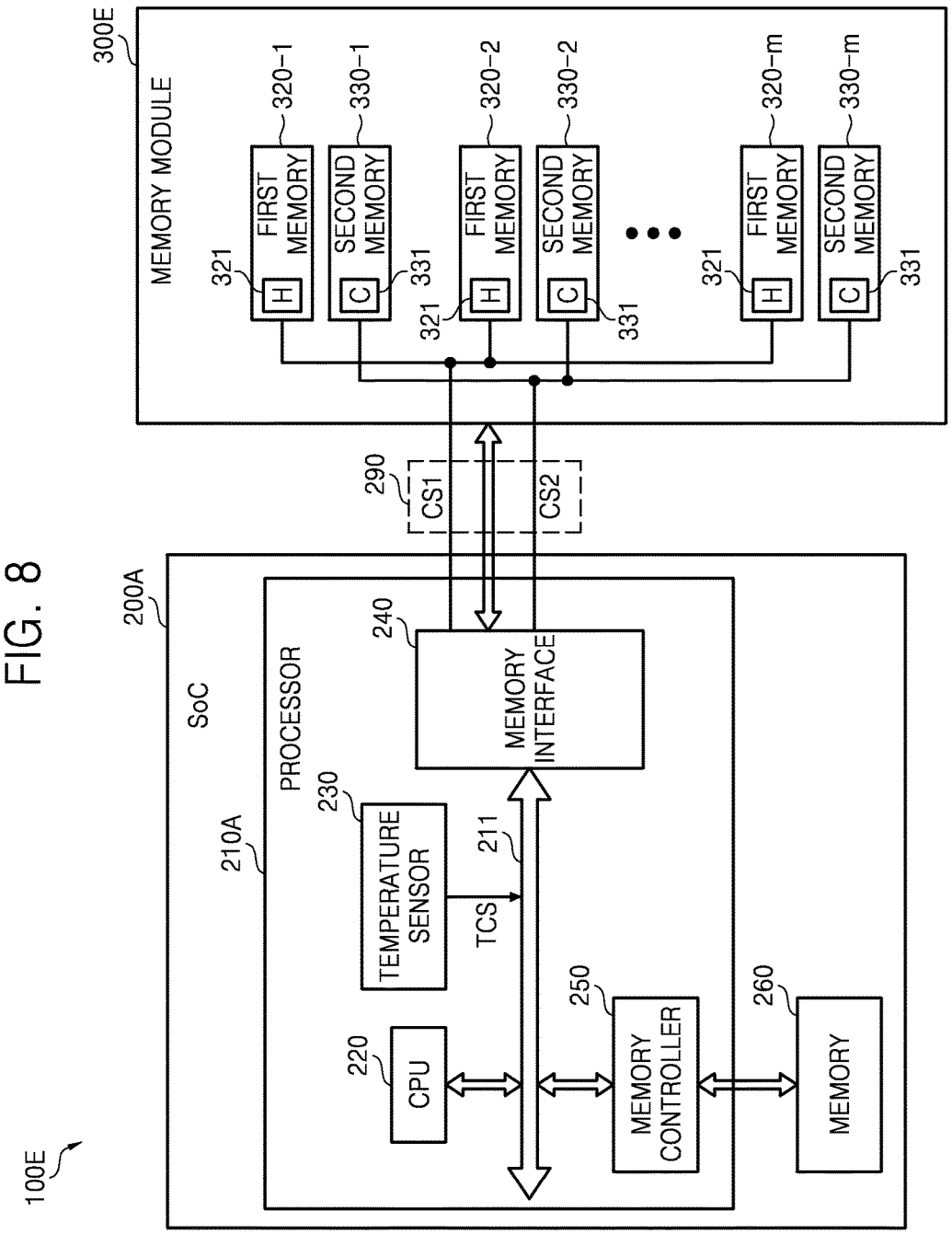
FIG. 8 is a block diagram of the data processing system according to still another exemplary embodiment of the present inventive concepts.

FIG. 8 is a block diagram of the data processing system according to still another exemplary embodiment of the present inventive concepts. Referring to FIG. 8, a data processing system 100E may include the controller 200A and a memory device 300E. The controller 200A and the memory device 300E may transmit or receive a command and/or data to or from each other through the interface 290.

The memory device 300E may be embodied in the memory module described above. The memory device 300E includes a plurality of first memories 320-1 to 320-m, where m is a natural number equal to or more than two, and a plurality of second memories 330-1 to 330-m. Each of the plurality of first memories 320-1 to 320-m and each of the plurality of second memories 330-1 to 330-m may be packaged into a memory package. A type of the memory package is as described above.

A structure and an operation of each of the plurality of first memories 320-1 to 320-m are substantially the same as or similar to a structure and an operation of the first memory 320 shown in FIG. 1. A structure and an operation of each of the plurality of second memories 330-1 to 330-m are substantially the same as or similar to a structure and an operation of the second memory 330 shown in FIG. 1.

Each of the plurality of first memories 320-1 to 320-m is enabled according to the first enable signal CS1. In addition, each of the plurality of second memories 330-1 to 330-m is enabled according to the second enable signal CS2.

According to an exemplary embodiment, data stored in one of the first memory 320-1 and the second memory 330-1 may be copied into the other of the first memory 320-1 and the second memory 330-1 according to the copy operation controlled by the controller 200A. According to another exemplary embodiment, data stored in at least one of the plurality of first memories 320-1 to 320-m may be copied into at least one of the plurality of second memories 330-1 to 330-m according to the copy operation controlled by the controller 200A.

Figure 9:
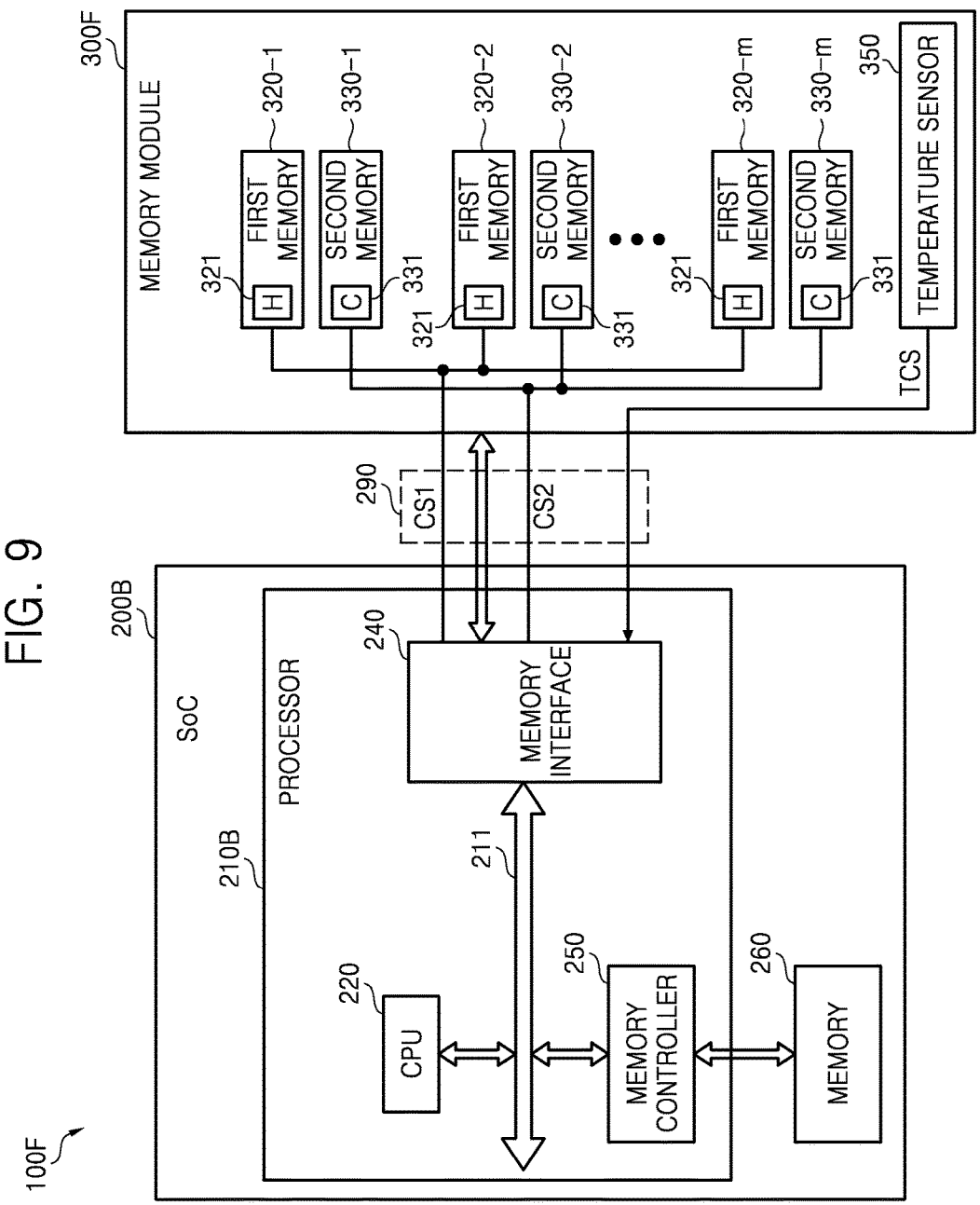
FIG. 9 is a block diagram of the data processing system according to still another exemplary embodiment of the present inventive concepts.

FIG. 9 is a block diagram of the data processing system according to still another exemplary embodiment of the present inventive concepts. Referring to FIG. 9, a data processing system 100F may include the controller 200B and a memory device 300F. The controller 200B and the memory device 300F may transmit or receive a command and/or data to or from each other through the interface 290.

Except that the CPU 220 receives a temperature signal TCS from the memory device 300F, a structure and an operation of the data processing system 100E shown in FIG. 8 are substantially the same as a structure and an operation of the data processing system 100F shown in FIG. 9.

The memory device 300F may be embodied in the memory module described above. The memory device 300F includes the temperature sensor 350 which senses an ambient temperature of the memory device 300F and outputs a temperature signal TCS. The temperature signal TCS output from the temperature sensor 350 may be transferred to the CPU 220 through the interfaces 240 and 290.

The temperature sensor 350 may perform a function the same as or similar to the temperature sensor TS1 embodied in each of the plurality of first memories 320-1 to 320-m and/or the temperature sensor TS2 embodied in each of the plurality of second memories 330-1 to 330-m. According to exemplary embodiments, a temperature signal output from the temperature sensor TS1 embodied in each of the plurality of first memories 320-1 to 320-m and/or the temperature sensor TS2 embodied in each of the plurality of second memories 330-1 to 330-m instead of the temperature sensor 350 may be transferred to the CPU 220 through the interfaces 240, 290, and 310.

Although the above examples depict only two types of memories, such as a low-temperature memory and a high-temperature memory, more than two types of memories, for example, that cover more than two ranges, may be used. In this case, the different memories may be enabled at different temperature ranges, and data from certain of the memories may be copied to certain other memories based on these ranges and control signals generated by a controller.

Figure 10:
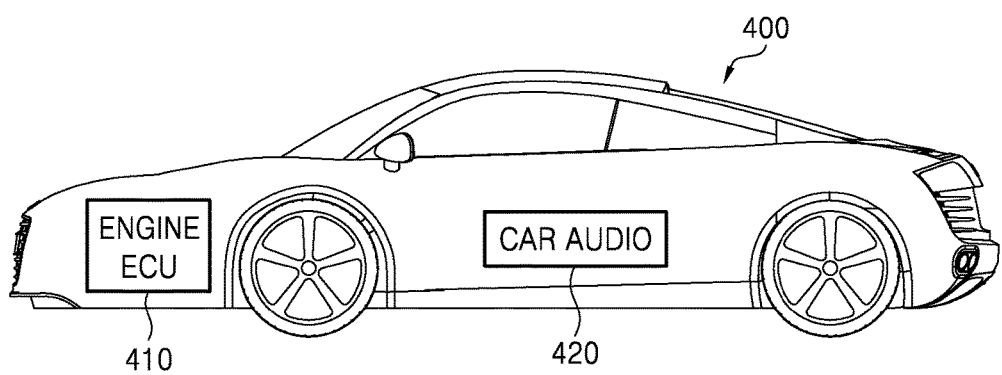
FIG. 10 is a schematic block diagram of an automobile which includes the data processing system according to an exemplary embodiment of the present inventive concepts.

FIG. 10 is a schematic block diagram of an automobile that includes the data processing system according to an exemplary embodiment of the present inventive concepts. An automobile 400 shown in FIG. 10 may include an engine ECU 410 and a car audio 420. The automobile 400 may further include various configuration elements which are not shown. The engine control unit (ECU) 410, the car audio 420, and each of the configuration elements may include at least one of the data processing systems 100A to 100F described referring to FIGS. 1 to 9. As such, a high-temperature memory may be enabled more often in the engine control unit 410 than in the car audio 420 due to generally hotter temperatures at the engine. In this case, the same memory device using the same timings and voltages can be used at both locations, without the need to dynamically change voltage or frequencies of signals used to control the memories. Rather, a temperature determination at each location determines which of a plurality of chips should be used for memory access.

Figure 11:
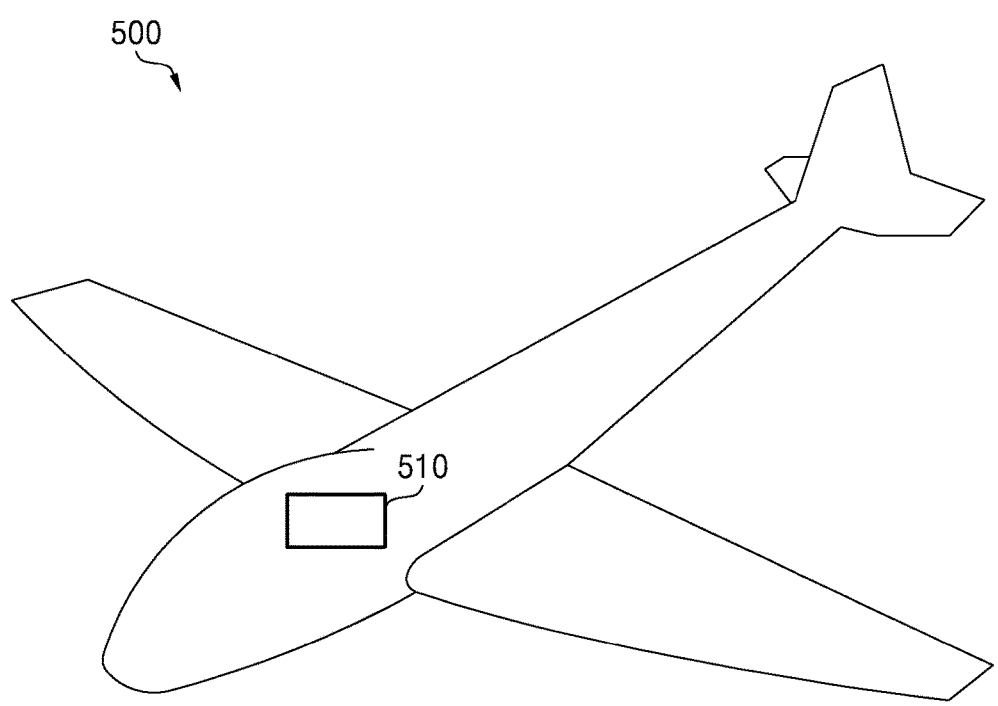
FIG. 11 is a schematic block diagram of an aircraft which includes the data processing system according to an exemplary embodiment of the present inventive concepts.

FIG. 11 is a schematic block diagram of an aircraft that includes the data processing system according to an exemplary embodiment of the present inventive concepts. An aircraft 500 shown in FIG. 11 includes a data processing system 510 related to an operation of the aircraft 500. The data processing system 510 may include at least one of the data processing systems 100A to 100F described referring to FIGS. 1 to 9.

The data processing system 510 may be embodied in an electronic flight instrument system (EFIS), a flight management system (FMS), a flight management computer (FMC), or an auto flight system (AFS). Certain sections of an aircraft may be subject to a wide range of temperatures as the aircraft moves between a sea-level temperature and a cruising altitude temperature. Thus, the data processing systems 100A to 100F disclosed herein can improve reliability and efficiency of certain electronics installed on the aircraft.

The automobile 410 shown in FIG. 10 and the aircraft 500 shown in FIG. 11 are exemplarily shown as a device including at least one of the data processing systems 100A to 100F described referring to FIGS. 1 to 9, and each of the data processing systems 100A to 100F according to an exemplary embodiment of the present inventive concepts can be used in other industrial electronic devices encountering a wide temperature range, for example, a vessel, a satellite, or a military electronic device.

A memory device according to an exemplary embodiment of the present inventive concepts includes different memory chips manufactured through different manufacturing processes to be capable of operating in different temperature ranges, thereby ensuring an operation of the memory device according to a rapid change in temperature. For example, different manufacturing processes may be used for different types of memory chips (e.g., volatile versus non-volatile chips, or NAND flash versus MRAM). Alternatively, different manufacturing processes may be used for the same types of memory chips, wherein the different processes provide different physical characteristics of the memory chips that control or dissipate heat in different ways.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of controlling a memory device in a data processing system, the memory device including at least a first memory chip and a second memory chip, the method comprising:
   generating a temperature signal that reflects a temperature at the data processing system;
   based on the temperature signal, determining if the temperature at the data processing system is lower than a low temperature threshold;
   based on the temperature signal, determining if the temperature at the data processing system is higher than a high temperature threshold;
   when it is determined that the temperature at the data processing system is lower than the low temperature threshold, enabling the second memory chip and disabling the first memory chip; and
   when it is determined that the temperature at the data processing system is higher than the high temperature threshold, enabling the first memory chip and disabling the second memory chip,
   wherein the high temperature threshold has a higher temperature value than the low temperature threshold.

2. The method of claim 1, further comprising:
   when it is determined that the temperature at the data processing system is higher than the low temperature threshold and lower than the high temperature threshold, enabling both the first memory chip and the second memory chip.

3. The method of claim 2, further comprising:
   when it is determined that the temperature at the data processing system is higher than the low temperature threshold and lower than the high temperature threshold, copying data from one of the first memory chip or second memory chip to the other of the first memory chip or second memory chip.

4. The method of claim 3, further comprising:
   copying data from the second memory chip to the first memory chip when a temperature passes and increases above the low temperature threshold, and
   copying data from the first memory chip to the second memory chip when a temperature passes and decreases below the high temperature threshold.

5. The method of claim 1, wherein the temperature signal reflects an ambient temperature at the memory device.

6. The method of claim 1, further comprising:
   controlling the first memory chip to operate within a first range of temperatures; and
   controlling the second memory chip to operate within a second range of temperatures,
   wherein the first range of temperatures is higher than the second range of temperatures, and the first range of temperatures overlaps the second range of temperatures.

7. The method of claim 6, wherein:
   the first memory chip operates most efficiently in the first range of temperatures; and
   the second memory chip operates most efficiently in the second range of temperatures.

8. The method of claim 1, wherein the first memory chip is part of a first semiconductor package of the memory device, and the second memory chip is part of a second semiconductor package of the memory device.

9. The method of claim 1, wherein the enabling/disabling of the first and second memory chips is accomplished using a chip enable signal.

10. A data processing system comprising:
    a first memory;
    a second memory;
    a temperature sensor configured to sense a temperature at the data processing system and generate a temperature signal; and
    a controller,
    wherein the controller is configured to control whether the first memory is enabled or disabled based on the temperature signal and a first temperature threshold associated with the first memory, and to control whether the second memory is enabled or disabled based on the temperature signal and a second temperature threshold associated with the second memory, wherein the second temperature threshold is lower than the first temperature threshold.

11. The data processing system of claim 10, wherein the controller is configured to enable only the first memory from among the first memory and second memory when the sensed temperature is higher than the first temperature threshold, and enable only the second memory from among the first memory and second memory when the sensed temperature is lower than the second temperature threshold.

12. The data processing system of claim 11, wherein the controller is configured to enable the first memory and the second memory when the sensed temperature is higher than the second temperature threshold and is lower than the first temperature threshold.

13. The data processing system of claim 11, wherein the controller is configured to enable the second memory and copy data stored in the first memory into the enabled second memory when the sensed temperature becomes lower than the first temperature threshold, and to disable the first memory when the sensed temperature becomes lower than the second temperature threshold.

14. The data processing system of claim 11, wherein the controller is configured to enable the first memory and copy data stored in the second memory into the enabled first memory when the sensed temperature becomes higher than the second temperature threshold, and disable the second memory when the sensed temperature becomes higher than the first temperature threshold.

15. The data processing system of claim 10, wherein the first memory and the second memory are first and second respective memory chips packaged into one package.

16. The data processing system of claim 10, wherein the first memory and the second memory are first and second respective memory chips attached to one memory module.

17. The data processing system of claim 10, wherein the first and second memories are part of a memory device connected to the controller through an interface, and the temperature sensor is located at one of the controller or the memory device.

18. A controller for controlling a memory device including a first memory chip and a second memory chip, the controller configured to:
   determine whether a sensed temperature at one of the controller or the memory device is higher than a first threshold temperature;
   determine whether the sensed temperature is lower than a second threshold temperature;
   enable the first memory chip and disable the second memory chip when the sensed temperature is higher than the first threshold temperature; and
   enable the second memory chip and disable the first memory chip when the sensed temperature is lower than the second threshold temperature,
   wherein the second threshold temperature is lower than the first threshold temperature.

19. The controller of claim 18, wherein the controller is further configured to:
   enable both the first memory chip and the second memory chip when the sensed temperature is higher than the second threshold temperature, and is lower than the first threshold temperature.

20. The controller of claim 19, wherein the controller is further configured to:
   when the sensed temperature is lower than the first threshold temperature and higher than the second threshold temperature, copy data from one of the first memory chip and the second memory chip to the other of the first memory chip and the second memory chip.

* * * * *